United States Patent [19]

Schuetz et al.

[11] Patent Number: 4,763,301
[45] Date of Patent: Aug. 9, 1988

[54] INTEGRATED DYNAMIC SEMICONDUCTOR MEMORY WITH COMPLEMENTARY CIRCUITRY AND WORD LINE VOLTAGE CONTROL

[75] Inventors: Alfred Schuetz, Zorneding; Wolfgang Mueller; Ewald Soutschek, both of Putzbrunn, all of Fed. Rep. of Germany

[73] Assignee: Siemens Aktiengesellschaft, Berlin and Munich, Fed. Rep. of Germany

[21] Appl. No.: 750,145

[22] Filed: Jul. 1, 1985

[30] Foreign Application Priority Data

Jul. 25, 1984 [DE] Fed. Rep. of Germany ....... 3427454

[51] Int. Cl.$^4$ .................. G11C 8/00; H03K 19/094
[52] U.S. Cl. .................................. 365/181; 365/203; 365/230
[58] Field of Search ............... 360/189, 190, 230, 149, 360/181, 203, 204; 307/451, 452, 482, 449

[56] References Cited

U.S. PATENT DOCUMENTS

| | | | |
|---|---|---|---|
| 4,051,388 | 9/1977 | Inukai | 307/482 X |
| 4,145,622 | 3/1979 | Hofmann et al. | 307/482 X |
| 4,267,464 | 5/1981 | Takemae et al. | 307/482 X |
| 4,389,714 | 6/1983 | Nakao | 365/189 |
| 4,618,784 | 10/1986 | Chappell et al. | 307/452 X |

OTHER PUBLICATIONS

IEEE Transactions on Electron Devices, vol. ED-29, No. 4, Apr. 1982, "An n-Well CMOS Dynamic RAM", pp. 714–718.

Primary Examiner—Stuart N. Hecker
Assistant Examiner—Alyssa H. Bowler
Attorney, Agent, or Firm—Hill, Van Santen, Steadman & Simpson

[57] ABSTRACT

An integrated circuit for a dynamic semiconductor random access memory, constructed of complementary transistors, has memory cells connected to bit lines by way of individual selection transistors of a first channel type, the operation of which is controlled by word lines. The voltage on the word lines is controlled by a first switching transistor of a second channel type, controlled by the output of a decoder. The first switching transistor is connected between the word line and a selection voltage which alternates between two voltage values of different operational signs, and the gate of the first switching transistor is connected through a capacitor to the selection voltage and through a second switching transistor having its gate at reference potential, to the output of the decoder.

5 Claims, 1 Drawing Sheet

INTEGRATED DYNAMIC SEMICONDUCTOR MEMORY WITH COMPLEMENTARY CIRCUITRY AND WORD LINE VOLTAGE CONTROL

BACKGROUND OF THE INVENTION

1. Field of the Invention

The present invention relates to an integrated circuit for a dynamic semiconductor memory and more particularly to such a unit which employs complementary technology.

2. Prior Art

Dynamic memory circuits are described in IEEE Transactions On Electron Devices, Vol. ED-29, No. 4, April 1982, pages 714–718. As described, the memory circuit incorporates a P-channel selection transistor and an N-channel switching transistor, by which the word lines are respectively switched from non-selected to selected condition. This involves a reversal of the charge on the word line capacitances, and this charge reversal takes place faster than would be the case if N-channel selection transistors were used. However, the storage capacitor of an address memory cell can only be discharged (through a P-channel selection transistor and an N-channel switching transistor) to a potential which corresponds to the cut-in voltage of the selection transistor. The storage capacitor is prevented from assuming a lower voltage, by the inhibition of the selection transistor. Therefore, the full voltage range established by the supply voltage and the reference potential is not available to the storage capacitor for the storage of digital signals.

BRIEF SUMMARY OF THE INVENTION

The principal object of the present invention is to provide an integrated circuit in which the full voltage range between the supply voltage and the reference potential is made available to the storage capacitor.

This advantage is obtained in the present invention by the use of a complementary circuit in which the word line is connected, by way of a first switching transistor, to a terminal to which two alternating voltage values are applied having different operational signs, and a capacitor is connected between this terminal and the gate of the first switching transistor. The gate of the first switching transistor is also connected to a decoder signal through a second switching transistor, the gate of which is maintained at reference potential.

The present invention attains the advantage that the word line is controlled to have greatly different voltages in the selected and non-selected conditions. The full range of voltages established by the supply voltage and the reference potential is thereby made available for the storage of digital signals.

These and other objects and advantages of the present invention will become manifest by an examination of the following description and the accompanying drawings.

BRIEF DESCRIPTION OF THE DRAWINGS

Reference will now be made to the accompanying drawings in which.

DESCRIPTION OF THE PREFERRED EMBODIMENT

Figure 1:
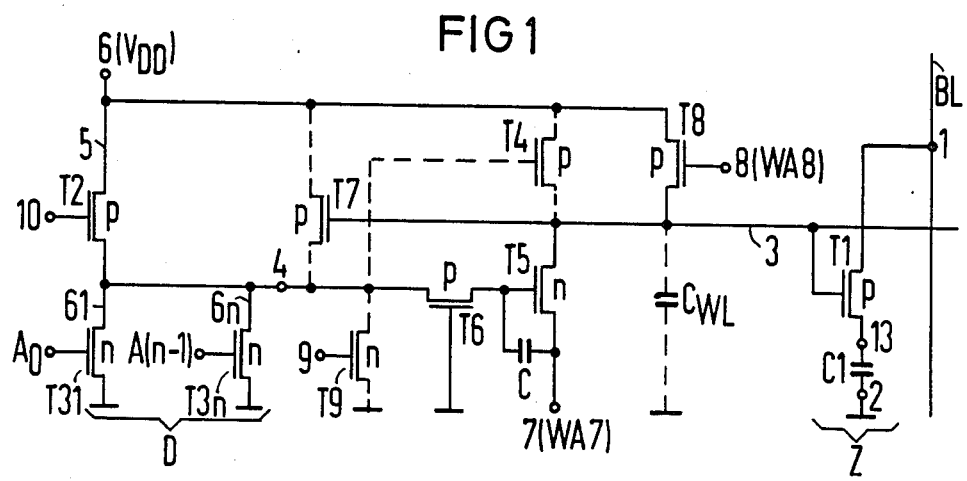
FIG. 1 is a schematic diagram of a exemplary embodiment of the present invention.

FIG. 1 illustrates a single-memory cell of a dynamic semiconductor memory with random access, sometimes referred to as a DRAM. The cell is indicated in FIG. 1 as Z. The cell contains a P-channel selection transistor T1 and a storage capacitor C1, connected in series therewith. This series circuit is connected between terminal 1 of a bit line BL and a terminal 2 which is wired to a reference potential. A word line 3 which is connected to the gate of T1 serves for addressing the memory cell Z. In the non-selected condition of the word line 3, the word line assumes a relatively high voltage corresponding to the supply voltage $V_{DD}$, and in the selected condition, in which the storage capacitor C1 is connected through the conductive selection transistor T1 to the bit line BL, the word line assumes a lower voltage potential. The voltage on the word line 3 is controlled by the output 4 of a decoder D which comprises a P-channel transistor T2 and a first circuit branch 5, and one or more N-channel transistors T31-T3n in a total of n second circuit branches 61 through 6n. The circuit branch 5 is connected to a terminal 6 wired to the supply voltage $V_{DD}$ and the output 4, whereas the circuit branches 6l through 6n are connected between the line 4 and and the reference potential. The decoder D operates in the conventional manner to select a single word line 3 at a time, and it will be understood that in a physical device a great number of word lines 3 are provided, each of which has a decoder of conventional construction supplying an output line 4. It will also be understood that in a physical device the plurality of bit lines BL is provided, so that a great number of cells can be independently accessed.

The output line 4 of the decoder D is connected to the gate of a N-channel transistor T5 through which the word line 3 is connected to a terminal 7. A P-channel transistor T6 has its gate connected to reference potential and is connected in series between the output line 4 and the gate of the transistor T5. The gate of the transistor T5 is also connected by capacitor C to the terminal 7. A P-channel transistor T8 is connected between the terminal 6 and the word line 3 and its gate is connected to a gate terminal 8. The inherent line capacitance of the word line 3 is indicated by a capacitor $C_{WL}$ which is indicated in broken lines in FIG. 1 to indicate that it is inherent capacitance rather than a separate circuit component.

Figure 2:
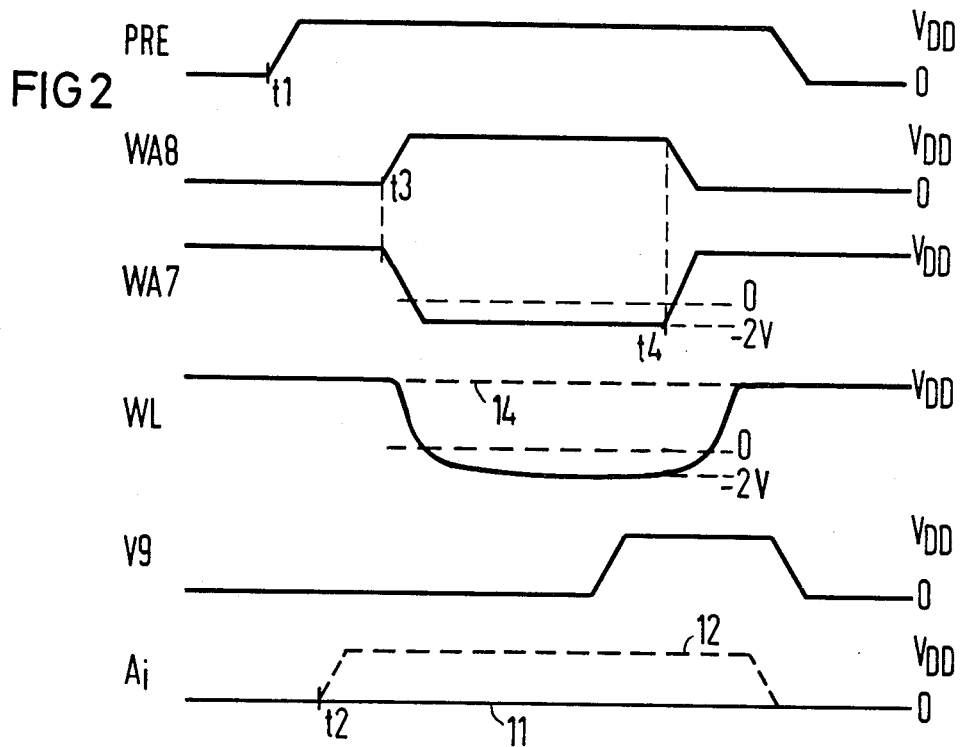
FIG. 2 is a set of voltage-time diagrams illustrating the operation of the circuit of FIG. 1.

Before an addressing operation begins, the word line 3 is connected, through conducting transistor T8, to the supply voltage $V_{DD}$. For this purpose, a voltage WA8 (FIG. 2) of relatively low voltage such as 0 volts is supplied to the gate terminal 8. At the beginning of the addressing operation, at time t1, the voltage PRE is applied to the gate terminal 10 of transistor T2, whereby the voltage at this terminal is increased from 0 volts to $V_{DD}$. The line 4 had been at the potential of $V_{DD}$ because of the conductive condition of the transistor T2. When the signal PRE is applied to the terminal 10 however, to raise the voltage on its gate, the transistor T2 is cut off, leaving the output line 4 floating. That is, its voltage is independent of the voltage level at terminal 6. At time t2, n address signals $A_0$ through $A_{(n-1)}$ are supplied to the correspondingly referenced gate terminals of T31 through T3n, as indicated in FIG. 2 by the voltage curve $A_i$. When all address signals have a value of 0 volts, as indicated by the curve 11 in FIG.

2, then all transistors T31 through T3n remain inhibited and the word line 3 is selected. Thus the output line 4 does not significantly discharge during the address operation, but continues to float at approximately the potential of $V_{DD}$ to which it had been charged during conduction of the transistor T2. The word line 3 is thereby selected, by transistor T5 being made conductive, so that it is discharged through a low potential during the entire addressing operation, as explained below in detail. The selection transistor T1 for the memory cell Z becomes conductive and switches the storage capacitor C1 to the voltage level appearing on the bit line BL.

On the other hand, when one or more of the address signals $A_0$ through $A_{(n-1)}$ assumes a value of $V_{DD}$, as indicated by the curve 12 of FIG. 2, then the output line 4 is brought to a voltage of 0 volts, by conduction of one or more of the transistors T31 through T3n. Thus the transistor T5 is cut off, and the word line 3 is allowed to remain at a high potential at approximatel $V_{DD}$ during the entire addressing operation. This corresponds to a non-selected condition of the word line 3, whereby the transistor T1 remains cut off and the memory cell Z is not addressed.

The relation between the voltage on the word line 3 and the voltage on the decoder output line 4 will now be described in detail. When the voltage WA8 applied to terminal 8 rises, beginning at time t3 (FIG. 2), the transistor T8 is cut off and the word line 3 is disconnected from the terminal 6, and floats at a potential independent of that of terminal 6. Also beginning at time t3, the terminal 7 is supplied with a selection voltage WA7 (FIG. 2) which falls from an upper value $V_{DD}$ to a lower value of, for example, −2 volts. When the output line 4 remains at a potential near $V_{DD}$ during the addressing operation (corresponding to selection of word line 3), then transistor T5 becomes conductive when the terminal 7 drops to −2 volts after time t3, since its gate remains driven by the voltage close to $V_{DD}$ present on the line 4. The transistor T5 then connects the word line 3 to a defined voltage of −2 volts at the terminal 7, so that the capacitor $C_{WL}$ is recharged from $V_{DD}$ to −2 volts, as indicated by the curve WL in FIG. 2. Therefore the selection transistor T1 is driven into its conductive condition to such a degree that it maintains the conductive connection between the storage capacitor C1 and the bit line BL (which may lie at 0 volts), even when the node 13 of the storage capacitor C1 has been discharged to 0 volts.

It will be apparent that in operation of the present invention, the storage capacitor is recharged from $V_{DD}$ to 0 volts when the bit line BL lies at 0 volts and the word line 3 is selected. This contrasts with traditional circuits of this type, which leave a residual charge on the capacitor C1 in excess of the reference potential, corresponding to the cut off voltage of the transistor T1. Since this value may be as high as 1.5 volts or higher, the present invention allows a greater differentiation in charge in the storage cell Z.

When the word line 3 is selected, the transistor T6 is conductive because the voltage of the output line 4 floats at potential close to $V_{DD}$ and the gate of the transistor T6 lies at reference potential.

The addressing operation is concluded at time t4, when the selection voltage WA7 applied to terminal 7 is again raised to $V_{DD}$, inhibiting transistor T5. At the same time the voltage WA8 applied to terminal 8 is lowered to 0 volts, so that the transistor T8 becomes conductive and the word line 3 rises to the voltage level of $V_{DD}$.

When the output line 4 of the decoder D discharges to 0 volts through one or more of the transistors T31-T3n (corresponding to non-selection of the word line 3), the transistor T5 remains inhibited after time t2 and does not become conductive at time t3 when the voltage level on terminal 7 is lowered. Even when the signal WA7 applied to terminal 7 reaches its lower voltage value of −2 volts, a corresponding voltage reduction is transmitted to the gate of the transistor T5 through the capacitor C, so the transistor T5 remains inhibited. The lowered voltage transmitted to the gate of the transistor T5 through the capacitor C also inhibits conduction of the transistor T6, so that the transistor T6 cannot increase the gate voltage at the transistor T5 to the 0 voltage level of the output line 4. With the transistor T5 remaining in its cut off condition, the word line 3 continues to float during the entire addressing operation at a voltage at or near the level of $V_{DD}$. This is indicated in FIG. 2 by curve 14. At time t4, when the addressing operation is ended, the voltage applied to terminal 7 rises and the voltage applied to terminal 8 drops. The word line 3 is then connected through the conductive transistor T8 to the terminal 6, which is at the voltage level $V_{DD}$, so that the inhibited condition of the transistor T5 remains unaltered.

In a preferred embodiment of the present invention, the word line 3 is connected by means of a P-channel transistor T4 to the terminal 6, and the gate of the transistor T4 is connected to the output of line 4 of the decoder D, as illustrated in broken lines in FIG. 1. The transistor T4 serves to conductively connect the word line 3 (in its non-selected condition in which the output line 4 is lowered to 0 volts), and which replaces the above described floating condition of the word line 3 with a conductive connection to a defined potential. This achieves the advantage of making the circuitry less sensitive to electrical noise which might otherwise have the effect of an undesired selection of the word line 3.

In another embodiment of the invention, P-channel transistor T7 is connected between the terminal 6 and the output line 4 of the decoder D. The gate of the transistor T7 is connected to the word line 3. The transistor T7 is conductive in the selected condition of the word line, when its gate potential is lowered to −2 volts, and switches transistor T7 to its conductive condition, conductively connecting the output line 4 with the terminal 6. This maintains the output line 4 at the desired condition, and prevents an undesired selection of the word line 3 which might result from long term leakage currents which could affect the voltage level during the floating condition of the line 4. It may also be expedient in the present invention to provide a N-channel transistor T9 connected between the output line 4 of the decoder D and the reference potential. The gate of the transistor T9 is connected to a terminal 9. A voltage V9 (FIG. 2) may be applied to the terminal 9. The voltage V9 rises from 0 to $V_{DD}$ shortly before time t4, whereupon the transistor T9 becomes conductive and prevents an increase in voltage on the line 4. This has the effect of positively preventing the voltage on the line 4 from exceeding the value of $V_{DD}$, which, if it occurred, could lead to the formation of undesired current paths and a possible thermal overload of the circuit.

In a possible modification of the present invention, several transistors may be replaced by transistors of the opposite channel type, whereby the applied voltages are substituted with voltages of the opposite sign from that described above. In other words, whereas the memory cell Z as described above include P-channel selection transistors T1 individually allocated to n-conductive tub-shaped subregions of a p-conductive semiconductor body on which the memory is constructed, the memory cells may instead be equipped with N-channel selection transistors and comprise p-conductive tub-shaped subregions of a n-semiconductor body.

It will be apparent to those skilled in the art that the various supply voltages and control voltages are connected in common to all memory cells in the integrated circuit, a particular cell being selected by a unique pari of word and bit lines.

Various other modifications and additions in the apparatus of the present invention will be apparent to those skilled in the art, without departing from the essential features of novelty thereof, which are intended to be defined and secured by the appended claims.

What is claimed is:

1. An integrated circuit for a dynamic semiconductor random access memory constructed with complimentary transistors, having one or more memory cells connected to allocated bit lines through individual selection transistors of a first channel type, said selection transistors each having a gate electrode and first and second other electrodes, and including one or more word lines allocated to said selection transistors, said gate electrode being connected to said allocated word line, decoder means for supplying a decoder output signal, a first switching transistor of a second channel type connected to said decoder output signal and operative for controlling the voltage level on said word line, said first switching transistor having a gate electrode and first and second other electrodes, said first other electrode being connected to said word line, a selection voltage terminal for presenting a selection voltage assuming two voltage values having different operational signs, said second other electrode of said first switching transistor being connected to said selection voltage terminal, a capacitor connected between the gate of said first switching transistor and said selection voltage terminal and a second switching transistor interconnected between the output of said decoder and the gate of said first switching transistor, and means for connecting the gate of said second switching transistor to a fixed reference potential.

2. Apparatus according to claim 1 including a third switching transistor of said first channel type for connecting said word line to a source of a supply voltage, and means for connecting said third switching transistor to the output of said decoder.

3. Apparatus according to claim 1 or 2, including a fourth switching transistor of the first channel type connected between the output of said decoder and said supply voltage, and means for connecting the gate of said fourth switching transistor to said word line.

4. Apparatus according to claim 3 including a fifth switching transistor of said first channel type connected between said word line and said supply voltage, and means connecting the gate of said fifth switching transistor with a control voltage which inhibits it during the period in which said selection voltage assumes one of its voltage values.

5. Apparatus according to claim 4 including a sixth switching transistor of said second channel type connected between the output of said decoder and reference potential, and means for supplying clock pulses to the gate of said sixth switching transistor corresponding in time with the edge of said selection voltage.

* * * * *